United States Patent
Forbes et al.

[19]

[11] Patent Number: 6,141,248
[45] Date of Patent: Oct. 31, 2000

[54] DRAM AND SRAM MEMORY CELLS WITH REPRESSED MEMORY

[75] Inventors: Leonard Forbes, Corvallis, Oreg.; Alan R. Reinberg, Westport, Conn.

[73] Assignee: Micron Technology, Inc., Boise, Id.

[21] Appl. No.: 09/362,909

[22] Filed: Jul. 29, 1999

[51] Int. Cl.$^7$ ................................................. G11C 14/00
[52] U.S. Cl. ..................... 365/185.08; 365/149; 365/154
[58] Field of Search .............................. 365/185.08, 149, 365/154

[56] References Cited

U.S. PATENT DOCUMENTS

| | | | |
|---|---|---|---|
| 4,271,487 | 6/1981 | Craycraft et al. | 365/185.08 |
| 4,333,166 | 6/1982 | Edwards | 365/185.08 |
| 4,760,556 | 7/1988 | Deguchi et al. | 365/149 |
| 5,042,011 | 8/1991 | Casper et al. . | |
| 5,111,427 | 5/1992 | Kobayashi et al. | 365/154 |
| 5,153,853 | 10/1992 | Eby et al. . | |
| 5,280,205 | 1/1994 | Green et al. . | |
| 5,399,516 | 3/1995 | Bergendahl et al. . | |
| 5,418,739 | 5/1995 | Takasugi . | |
| 5,424,569 | 6/1995 | Prall . | |
| 5,488,587 | 1/1996 | Fukumoto . | |
| 5,497,494 | 3/1996 | Combs et al. . | |
| 5,619,642 | 4/1997 | Nielson et al. . | |
| 5,627,785 | 5/1997 | Gilliam et al. . | |
| 5,796,670 | 8/1998 | Liu . | |
| 5,801,401 | 9/1998 | Forbes . | |
| 5,852,306 | 12/1998 | Forbes . | |
| 5,870,327 | 2/1999 | Gitlin et al. . | |
| 5,880,991 | 3/1999 | Hsu et al. . | |
| 5,986,932 | 11/1999 | Ratnakumar et al. | 365/185.08 X |
| 6,009,011 | 12/1999 | Yamauchi | 365/185.08 X |

OTHER PUBLICATIONS

Dipert et al., "Flash Memory Goes Mainstream," IEEE SPECTRUM, Oct. 1993/vol. 30/Nov. 10, pp. 48–52.

*Primary Examiner*—Huan Hoang
*Attorney, Agent, or Firm*—Dickstein, Shapiro, Morin & Oshinsky LLP

[57] ABSTRACT

The transfer device of a typical DRAM cell is replaced with a transistor having an additional gate. The unique cell can be accessed as a typical DRAM cell by reading from or writing to a storage capacitor or as a nonvolatile memory by storing charges on the additional gate. Thus, a DRAM cell having a nonvolatile memory component within its cell is formed in a simple and cost effective manner. Transistors in a typical SRAM cell are also replaced by the transistors with the additional gate to form a SRAM cell having a nonvolatile component built within its cell.

83 Claims, 11 Drawing Sheets

DRAM AND SRAM MEMORY CELLS WITH REPRESSED MEMORY

BACKGROUND OF THE INVENTION

1. Field of the Invention

The present invention relates to the field of semiconductor memory devices and, more particularly to a dynamic random access memory (DRAM) cell with a non-volatile memory component and a static random access memory (SRAM) cell with a non-volatile memory component.

2. Description of the Related Art

An essential semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 10. Each cell 10 contains a storage capacitor 14 and an access field effect transistor or transfer device 12. For each cell, one side of the storage capacitor 14 is connected to a reference voltage (illustrated as a ground potential for convenience purposes). The other side of the storage capacitor 14 is connected to the drain of the transfer device 12. The gate of the transfer device 12 is connected to a signal known in the art as a word line 18. The source of the transfer device 12 is connected to a signal known in the art as a bit line 16 (also known in the art as a digit line). With the memory cell 10 components connected in this manner, it is apparent that the word line 18 controls access to the storage capacitor 14 by allowing or preventing the signal (representing a logic "0" or a logic "1") carried on the bit line 16 to be written to or read from the storage capacitor 14. Thus, each cell 10 contains one bit of data (i.e., a logic "0" or logic "1").

Referring to FIG. 2, an exemplary DRAM circuit 40 is illustrated. The DRAM 40 contains a memory array 42, row and column decoders 44, 48 and a sense amplifier circuit 46. The memory array 42 consists of a plurality of memory cells (constructed as illustrated in FIG. 1) whose word lines and bit lines are commonly arranged into rows and columns, respectively. The bit lines of the memory array 42 are connected to the sense amplifier circuit 46, while its word lines are connected to the row decoder 44. Address and control signals are input into the DRAM 40 and connected to the column decoder 48, sense amplifier circuit 46 and row decoder 44 and are used to gain read and write access, among other things, to the memory array 42.

The column decoder 48 is connected to the sense amplifier circuit 46 via control and column select signals. The sense amplifier circuit 46 receives input data destined for the memory array 42 and outputs data read from the memory array 42 over input/output (I/O) data lines. Data is read from the cells of the memory array 42 by activating a word line (via the row decoder 44), which couples all of the memory cells corresponding to that word line to respective bit lines, which define the columns of the array. One or more bit lines are also activated. When a particular word line and bit lines are activated, the sense amplifier circuit 46 connected to a bit line column detects and amplifies the data bit transferred from the storage capacitor of the memory cell to its bit line by measuring the potential difference between the activated bit line and a reference line which may be an inactive bit line. The operation of DRAM sense amplifiers is described, for example, in U.S. Pat. Nos. 5,627,785; 5,280,205; and 5,042,011, all assigned to Micron Technology Inc., and incorporated by reference herein.

DRAM devices are the most cost effective high speed memory used with computers and computer systems. They last (nearly) indefinitely and are available in very high density. They are, however, limited in the longevity of their memory. DRAM devices require constant refreshing and lose all knowledge of their state (i.e., contents) once power to the device is removed. It is desirable to have a memory device, such as a DRAM memory device, with all of the positive features of DRAM devices, e.g., cost, size, speed, availability, etc., that retains its memory state when power is removed from the device. That is, it is desirable to have DRAM cells with a nonvolatile memory component built within the cell.

A DRAM cell with a nonvolatile component would be very beneficial in numerous computer systems and computer applications. One application would be the saving and/or restoring of the state of a central processing unit (CPU) that is executing software instructions in a protected mode of operation, an example of which is disclosed in U.S. Pat. No. 5,497,494 to Combs et al., which is hereby incorporated by reference in its entirety. This application typically involves the use of memory separate from the main memory of the computer, typically referred to as shadow RAM, from which a BIOS program is executed and the CPU state is to be stored to and retrieved from. Having a DRAM device constructed with DRAM cells having a nonvolatile component would eliminate the need to have the separate shadow RAM.

This holds true for other computer systems that utilize shadow memory, such as, for example, the fault tolerant system disclosed in U.S. Pat. No. 5,619,642 to Nielson et al., which is hereby incorporated by reference in its entirety. In a fault tolerant system, a main memory contains data and error detection codes associated with each piece of data. A separate shadow memory is used to store data corresponding to the data stored in the main memory. If the system determines that accessed data from the main memory is erroneous, the corresponding data from the shadow memory is used and thus, faults in the main memory do not adversely effect the system (i.e., the system is fault tolerant). Again, memory separate from the main memory is required, which adds cost and adds to the size and complexity of the system. Having a DRAM device constructed with DRAM cells having a nonvolatile component would eliminate the need to have the separate shadow memory.

There has been attempts to include shadow memory on DRAM and SRAM devices, such as the memory disclosed in U.S. Pat. No. 5,399,516 to Bergendahl et al. and U.S. Pat. No. 5,880,991 to Hsu et al. These devices, however, place individual DRAM and/or SRAM cells on the same substrate as separate nonvolatile memory cells. They do not use a single DRAM (or SRAM) cell having its own integral nonvolatile component. Instead, separate cells are used, which adds cost, size and complexity to the memory. Having a DRAM device constructed with DRAM cells having a nonvolatile component would eliminate the need to have the separate DRAM and nonvolatile cells. A DRAM with a nonvolatile component would have many other uses in addition to those described by way of example herein.

SRAM devices are another form of RAM device. SRAM devices differ from DRAM devices in that they do not require constant refreshing. A standard SRAM cell 200 is shown in FIG. 3a. Cell 200 consists of four transistors 206, 208, 210, 212, and two control transistors 202 and 204. Data is stored with either a high potential at node A and a low potential at node B, or a low potential at node A and a high potential at node B. This means that two stable states are available which are defined as a logic "1" or a logic "0".

Cell 200 is embedded in an array of similar cells as shown in FIG. 4. A typical SRAM consists of a matrix of storage bits with bit capacity $2^N \times 2^M$ bits arranged in an array 275 with $2^M$ columns (bit lines) and $2^N$ rows (word lines).

To read data stored in the array 275, a row address is input and decoded by row decoder 280 to select one of the rows or word lines. All of the cells along this word line are activated. Column decoder 282 then addresses one bit out of the $2^M$ bits that have been activated and routes the data that is stored in that bit to a sense amplifier (not shown) and then out of the array 275. Data in and Data out are controlled by the Read/Write Control circuit 284.

Referring again to FIG. 3a, the logic state of SRAM cell 200, i.e., either a "1" or "0", is read by sensing the cell current on bit line pair comprised of bit lines 216 and 217 and/or the differential voltage developed thereon. When word line 218 is selected, cell 200 is activated by turning on control transistors 202 and 204. If the activated SRAM cell 200 is in logic state "1" node A is high and node B is low. Transistor 208 will be off, transistor 212 will be on, transistor 206 will be on, and transistor 210 will be off. Since transistors 212 and 204 are on, bit line 217 will carry cell current, while bit line 216 will not carry any cell current since transistor 208 is off.

The logic state "0" would be the opposite with node A low and node B high. Transistor 208 will be on, transistor 212 will be off, transistor 206 will be off, and transistor 210 will be on. Bit line 216 will carry cell current, while bit line 217 will not carry cell current.

FIG. 3b illustrates an alternative SRAM cell 250. In this cell 250, transistors 206 and 210 are replaced by two resistors 252, 254. The operation of the cell 250, however, is essentially the same as the operation of the cell 200 (FIG. 3a). The SRAM cell 250 can also be used in and accessed from the SRAM device illustrated in FIG. 4.

Although SRAM devices have their advantages, e.g., they do not require constant refreshing, they are not without their shortcomings. For example, similar to DRAM devices, SRAM devices also lose all knowledge of their state once power to the device is removed. A SRAM utilizing SRAM cells having a nonvolatile component would also be suitable for use in a computer system for startup/restart from protected mode and other shadow memory applications. Accordingly, there is a desire and need for a SRAM memory device that retains its memory state when power is removed from the device. That is, it is desirable to have SRAM cells with a nonvolatile memory component built within the cell.

SUMMARY OF THE INVENTION

The present invention provides a DRAM cell with a nonvolatile memory component built within the cell.

The present invention also provides a SRAM cell with a nonvolatile memory component built within the cell.

The above and other features and advantages of the invention are achieved by replacing the transfer device of a typical DRAM cell with a transistor having an additional gate. The unique cell can be accessed as a typical DRAM cell by reading from or writing to a storage capacitor. The cell can be accessed as a nonvolatile cell by storing a charge onto the additional gate (representative of one logic value) or erasing the charge from the additional gate (representative of another logic value) using a tunneling technique. Contents of the additional gate are retained even if power is removed from the cell. Thus, the DRAM cell has a nonvolatile component built into its cell. Whether a charge is stored on the additional gate is determined by a unique data sensing method. The method utilizes a response time of the cell to determine whether or not the additional gate contains a charge and thus, determines the logic value of the data within the cell. Thus, a DRAM cell having a nonvolatile memory component within its cell is formed in a simple and cost effective manner. Transistors in a typical SRAM cell are also replaced by the transistors with the additional gate to form a SRAM cell having a nonvolatile component built within its cell.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

Figure 1:
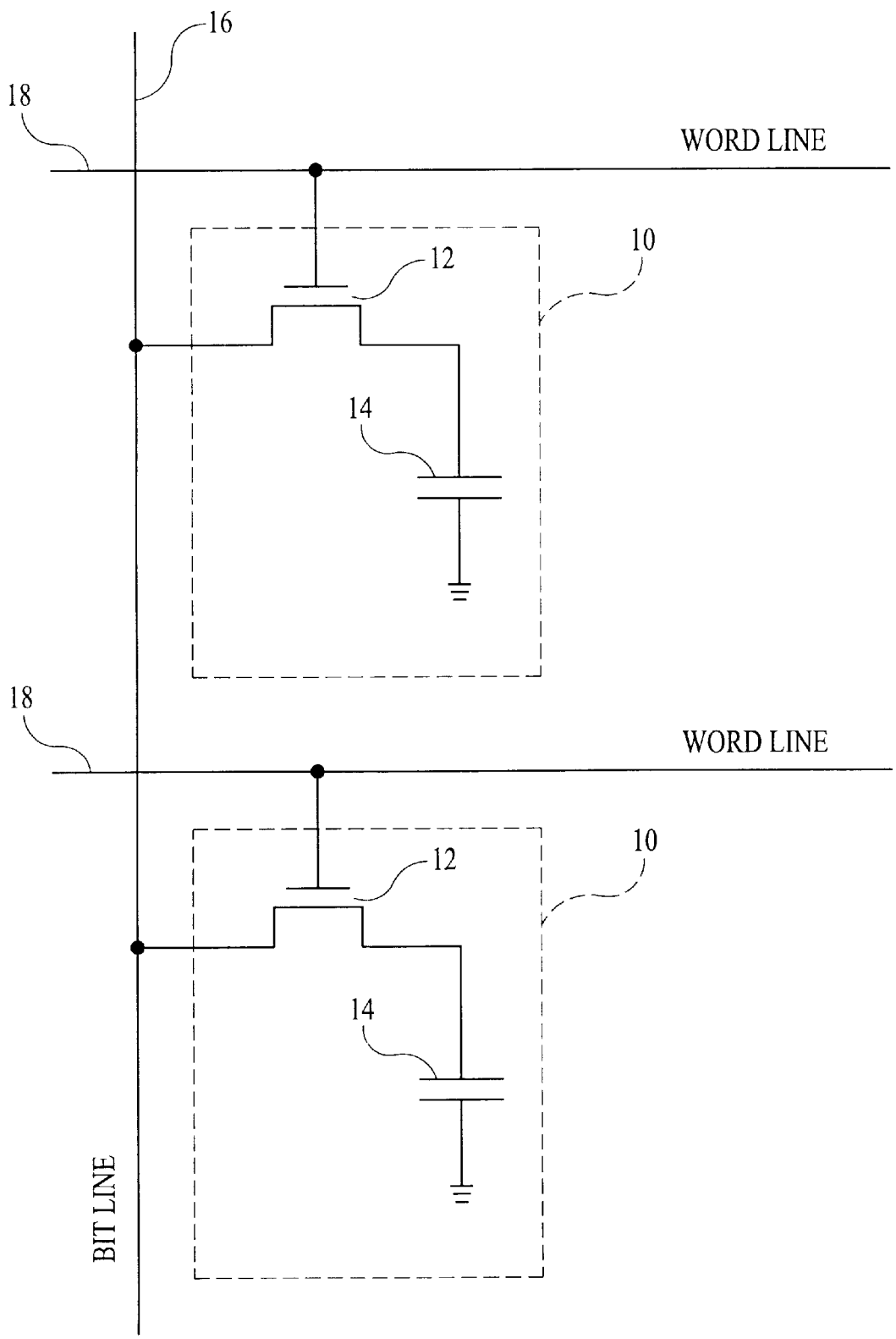
FIG. 1 is a circuit diagram illustrating conventional dynamic random access memory (DRAM) cells.
Figure 5A:
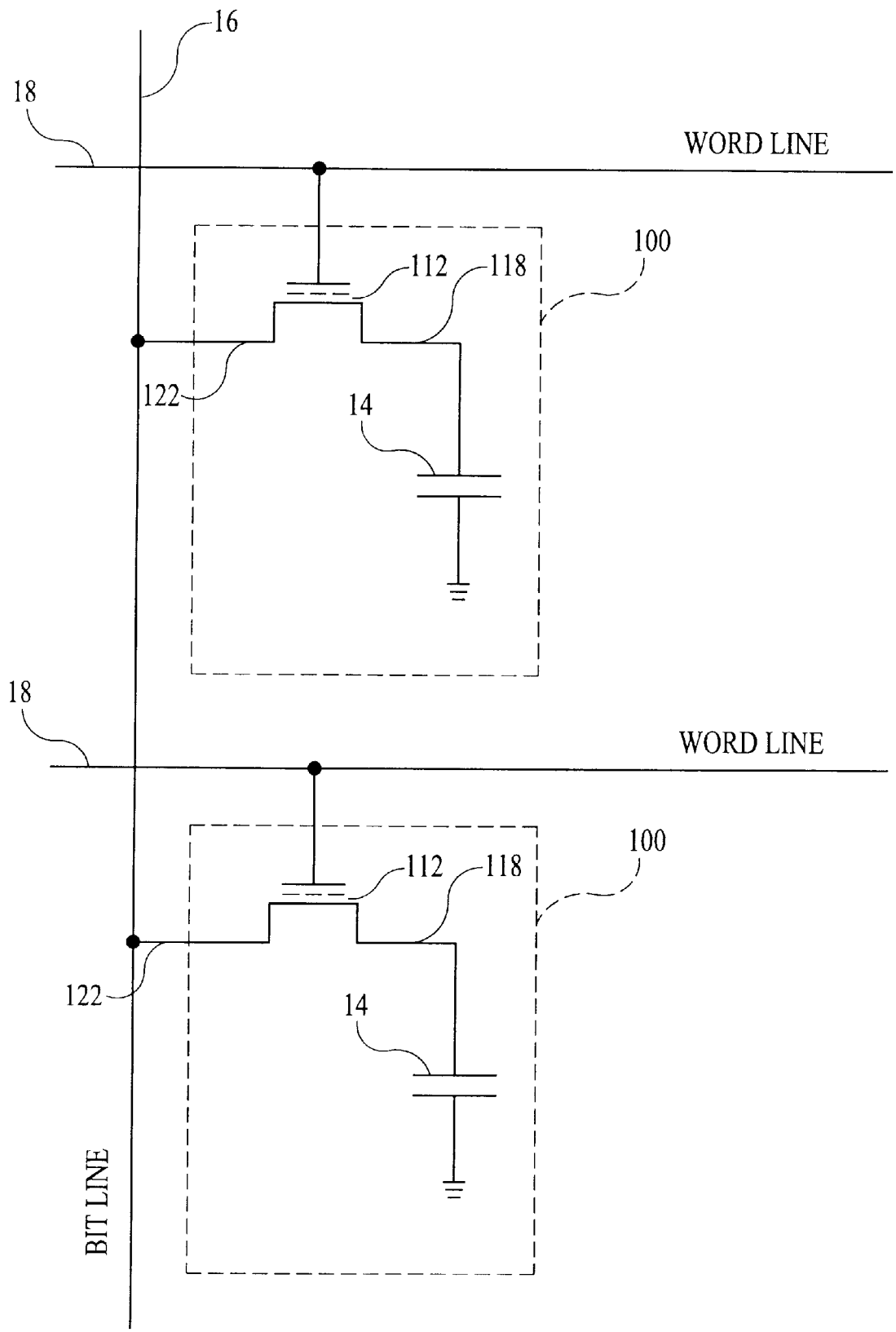
FIGS. 5a and 5b are circuit diagrams illustrating DRAM cells constructed in accordance with an embodiment of the present invention.
Figure 5B:
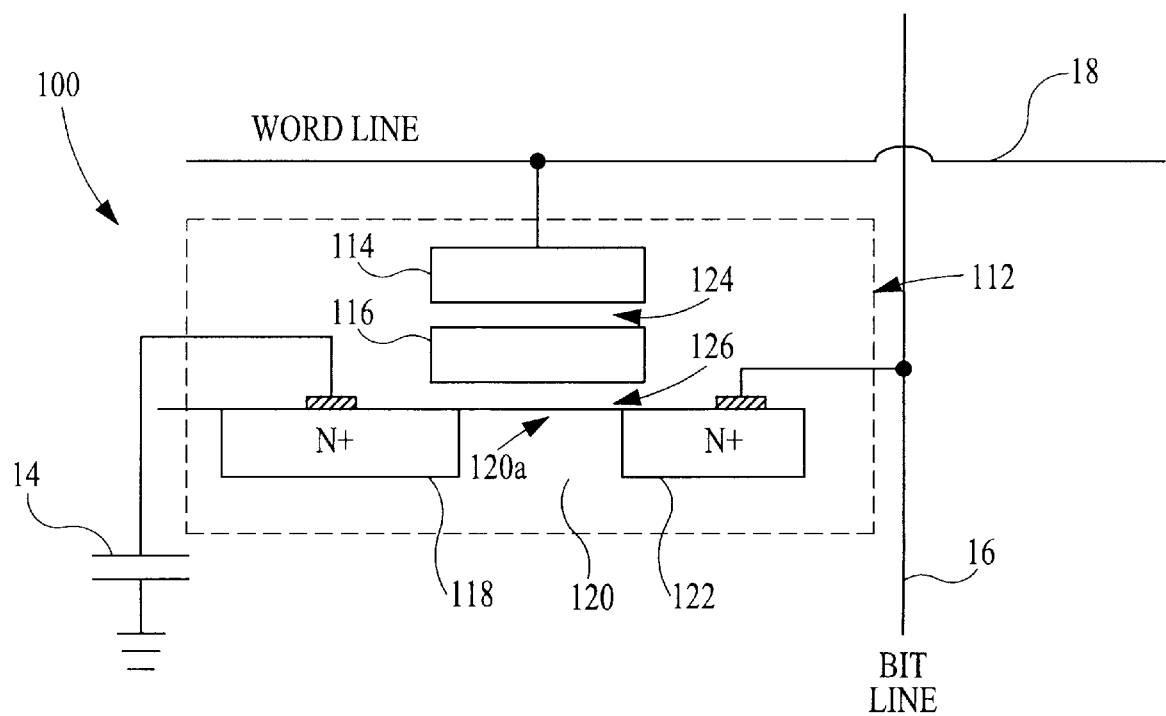

FIGS. 5a and 5b are circuit diagrams illustrating DRAM cells 100 constructed in accordance with an embodiment of the present invention. The cells 100 are similar to the cells 10 illustrated in FIG. 1 with the exception that a different transfer device 112 replaces the transfer device 12 (FIG. 1). The transfer device 112 is a transistor having a control gate 114 and an additional gate 116, often referred to as a floating gate, and is of the kind often used in flash memory devices. The transfer device 112 has a drain 118 connected to one end of the storage capacitor 14 and a source 122 connected to the bit line 16 (as in the conventional DRAM cell 10 illustrated in FIG. 1). The source 122 and drain 118 are constructed from a N+ type region of high impurity concentration formed on a P-type semiconductor substrate 120 and are separated by a channel region 120a. It is desirable that the floating gate 116 be constructed from polysilicon. It is also desirable that the floating gate 116 be is isolated from the control gate 114 by a dielectric material 124 and from the source 122, drain 118 and channel 120a by a thin layer of oxide 126. As will be described below, the use of the transfer device 112 allows the cell 100 of the present invention to be operated as either a conventional DRAM cell or as a nonvolatile memory cell (herein referred to as a DRAM with "repressed memory").

To write information into the DRAM portion (i.e., the storage capacitor 14) of the cell 100, all that is required is to place a large positive voltage onto the control gate 114 (via the word line 18) and the data from the bit line 16 will be transferred to the capacitor 14. This is similar to the way the conventional DRAM cell 10 (FIG. 1) is written to. As will be described below, however, the floating gate 116 may contain a charge on it. This charge may slightly alter the characteristics (e.g., resistance) of the transfer device 112. For example, the transfer of information to/from the bit line 16 may be slower in the cell 100 of the present invention when compared to a similar transfer in the conventional DRAM cell 10 illustrated in FIG. 1. This is a minor trade off considering that a DRAM cell is being provided with a nonvolatile portion without expensive and complex additional circuitry. Thus, when accessing the cell 100 as a DRAM, a voltage that exceeds the normal threshold voltage of the device 112 should be used to avoid any adverse effects attributable to a charge on the floating gate 116.

To write information into the nonvolatile portion (i.e., floating gate 116) of the cell 100, a tunnel-tunnel mode of operation will be used to program one of two different charge states onto the floating gate 116 (and thus, program the transfer device 112 into one of two states). That is, a tunnel mode is used to transfer electrons from the source 122 to the floating gate 116 to program the transfer device 112, its gate 116 and thus, the nonvolatile portion of the cell 100, to a first charge state (i.e., tunnel write operation). This is accomplished by driving the floating gate 116 (through the control gate 114 and word line 18) with a large positive voltage, such as, for example, twelve or fifteen volts, while grounding the source 122 (via the bit line 16). By doing so, the electrons present on the source 122 will tunnel their way to the floating gate 116, causing a negative charge to be present on the floating gate 116. It should be noted that this negative charge, referred to herein as the "first charge state," can be associated with either a logic "0" or "1" and that the invention is not limited to any particular association between the first charge state and a particular logic value. The one requirement is that the program, erase and sensing circuitry used to access the nonvolatile portion of the cell 100 associate the first charge state to the same logic value.

Likewise, a tunnel mode is used to transfer the electrons from the floating gate 116 to the source 122 to program the transfer device 112, its gate 116 and thus, the nonvolatile portion of the cell 100, to a second charge state (i.e., tunnel erase operation). This is accomplished by driving the floating gate 116 (through the control gate 114 and word line 18) with a large negative voltage, such as, for example, negative seven or ten volts, while driving the source 122 (via the bit line 16) with a positive voltage, such as, for example, five volts. By doing so, the electrons present on the floating gate 116 become uncomfortable due to the large negative potential next to them and they tunnel their way to the source 122, removing any negative charge present on the floating gate 116. It should be noted that the lack of a negative charge on the floating gate 116, referred to herein as the "second charge state," can be associated with either a logic "0" or "1" and that the invention is not limited to any particular association between the second charge state and a particular logic value. The one requirement is that the program, erase and sensing circuitry used to access the nonvolatile portion of the cell 100 associate the second charge state to the same logic value and that the logic value be different than the value chosen for the first charge state.

Figure 6:
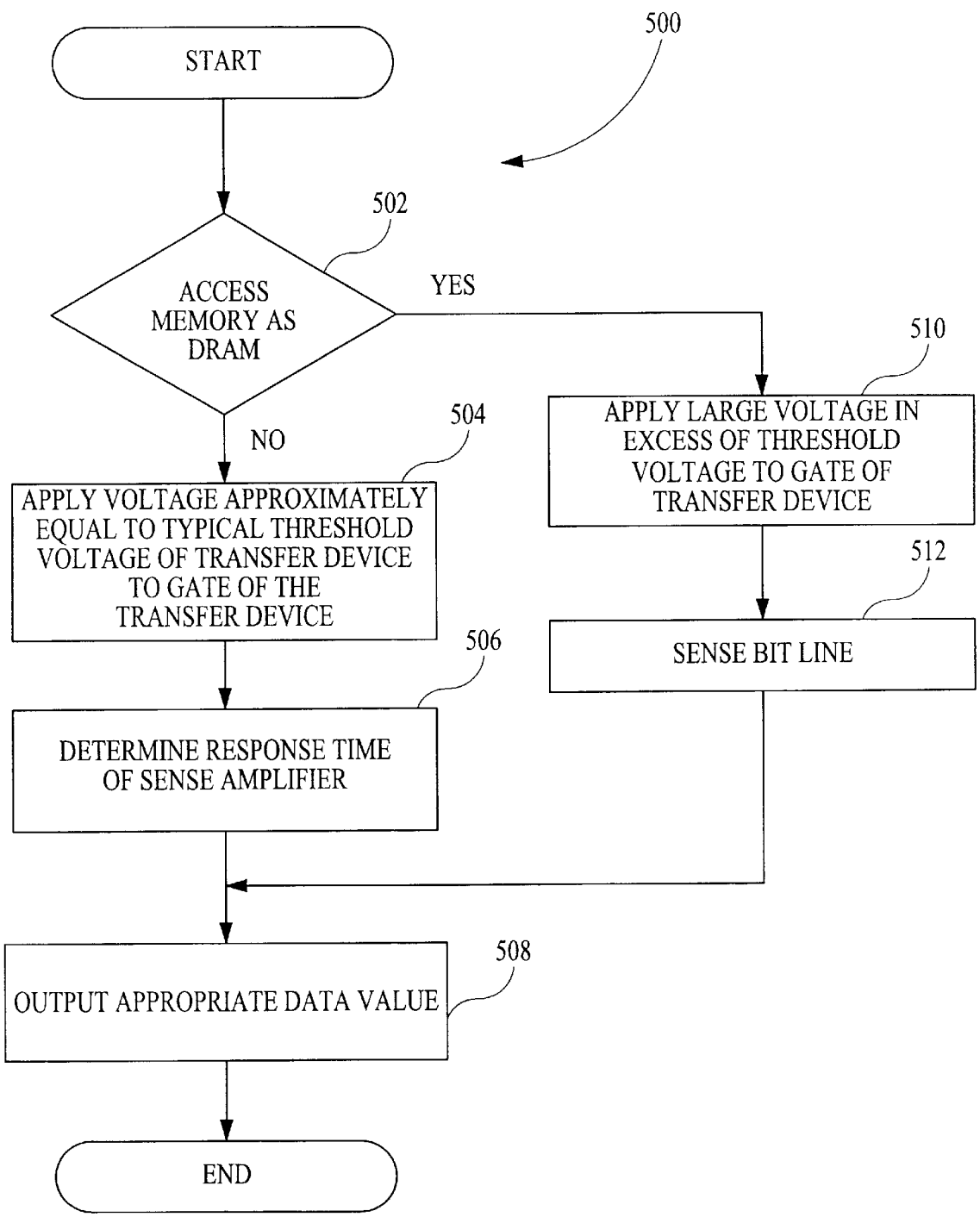
FIG. 6 illustrates an exemplary process for sensing the state of the nonvolatile memory component of the DRAM cells illustrated in FIGS. 5a and 5b.
Figure 7A:
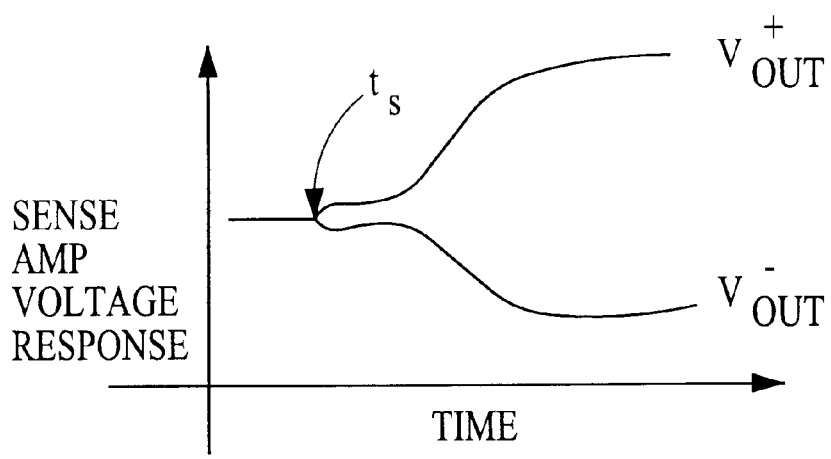
FIGS. 7a and 7b illustrate a sense amplifier voltage response over time associated with the sensing of the contents of the DRAM cells illustrated in FIGS. 5a and 5b.
Figure 7B:
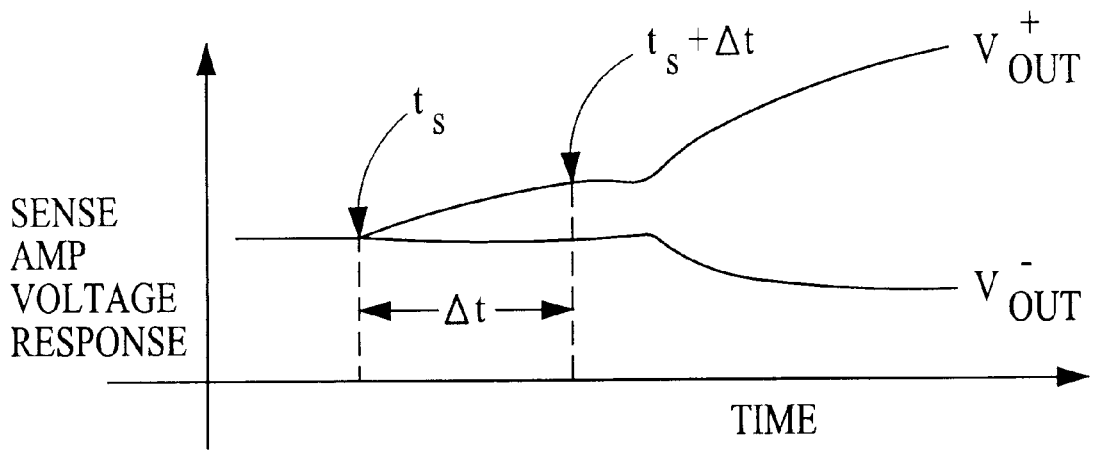

Referring to FIGS. 6, 7a and 7b, a description of how information is read/sensed from the cell 100 now follows. Initially it must be determined whether the cell is being accessed as a DRAM or as a nonvolatile memory (step 502). If the cell is to be operated as a DRAM, a voltage in excess of the normal threshold voltage of the cell's transfer device is applied to the control gate of the cell (step 510). A charge on the floating gate may effect the characteristics (e.g., resistance) of the transfer device and its threshold voltage. A difference in threshold voltage of the transfer device will have no effect on the potential transferred to the bit line, but it will effect the rate at which it is transferred. The difference in threshold voltage and resistance of the transfer device determines only the current, but the DRAM sense amplifiers respond only to potential differences.

Smaller differences in threshold voltage may alter the response time of the sense amplifier, but not the final potential difference sensed, which is the determinant factor in a DRAM. It is desirable for the word line to be driven to a voltage as far as possible in excess of the threshold voltage of the transfer device to minimize the resistance of the transfer device (typically a few thousand ohms). This results in the charge stored in the capacitor being transferred to the bit line in a sub-nanosecond time period. The sense amplifier subsequently responds with either a sensed Vout$^+$ or a Vout$^-$ (depending upon the charge stored in the capacitor) after time $t_s$ whether or not the floating gate is in the first charge state (step 512). Once the sense amplifier has sensed the potential on the bit line, the appropriate data value may be output (step 508).

If the nonvolatile portion of the cell is to be accessed, a voltage that is approximately equal to the typical threshold voltage of the cell transfer device is applied to the control gate of the cell (step 504). This will cause the charge stored on the capacitor to be transferred to the bit line. This charge is not being used for its data value since it represents the stored DRAM value. Instead, as will be described below, the charge is being used to determine the response time of the sense amplifier, since the response time is indicative of whether the transfer device is programmed to the first or second charge state (step 506).

As noted earlier, a charge on the floating gate may effect the characteristics (e.g., resistance) of the transfer device and its threshold voltage. The characteristics will vary depending upon the threshold voltage. For example, if the threshold voltage is high, e.g., 0.6 volts, the transfer device has a higher resistance and it will not conduct well. This would represent the case when electrons are stored on the floating gate. That is, the floating gate is programmed to the first charge state. Likewise, if the threshold voltage is low, e.g., 0.0 volts, the transfer device has a low resistance and it will conduct much better. This would represent the case when electrons are not stored on the floating gate. That is, the floating gate is programmed to the second charge state.

Thus, applying a voltage of about 1 volt, for example, the resistance of the transfer device can be sensed. The resistance will determine the response time of the sense amplifier.

If the transfer device has a high resistance because it has been programmed to the first charge state, the stored charge from the storage capacitor (whose value is not important) is transferred to the bit line much slower in comparison to the transfer of the charge described in steps 510 and 512 (i.e., DRAM operation). The sense amplifier subsequently responds with, for example, a sensed Vout$^+$ after time t$_S$+Δt (see FIG. 7b). It should be appreciated that the first charge state can be associated with a sensed Vout$^-$ instead of the Vout$^+$.

If the transfer device has a low resistance because it has been programmed with the second charge state, the stored charge from the storage capacitor (whose value is not important) is transferred to the bit line at approximately the same speed as the transfer of the charge described in steps 510 and 512 (i.e., DRAM operation). The sense amplifier subsequently responds with, for example, a sensed Vout$^-$ after time t$_S$ (see FIG. 7b). It should be appreciated that the second charge state can be associated with a sensed Vout$^+$ instead of the Vout$^-$. Once the response time of the sense amplifier in developing the appropriate potential, Vout$^+$ or Vout$^-$ has been determined, the appropriate data value may be output (step 508).

Figure 2:
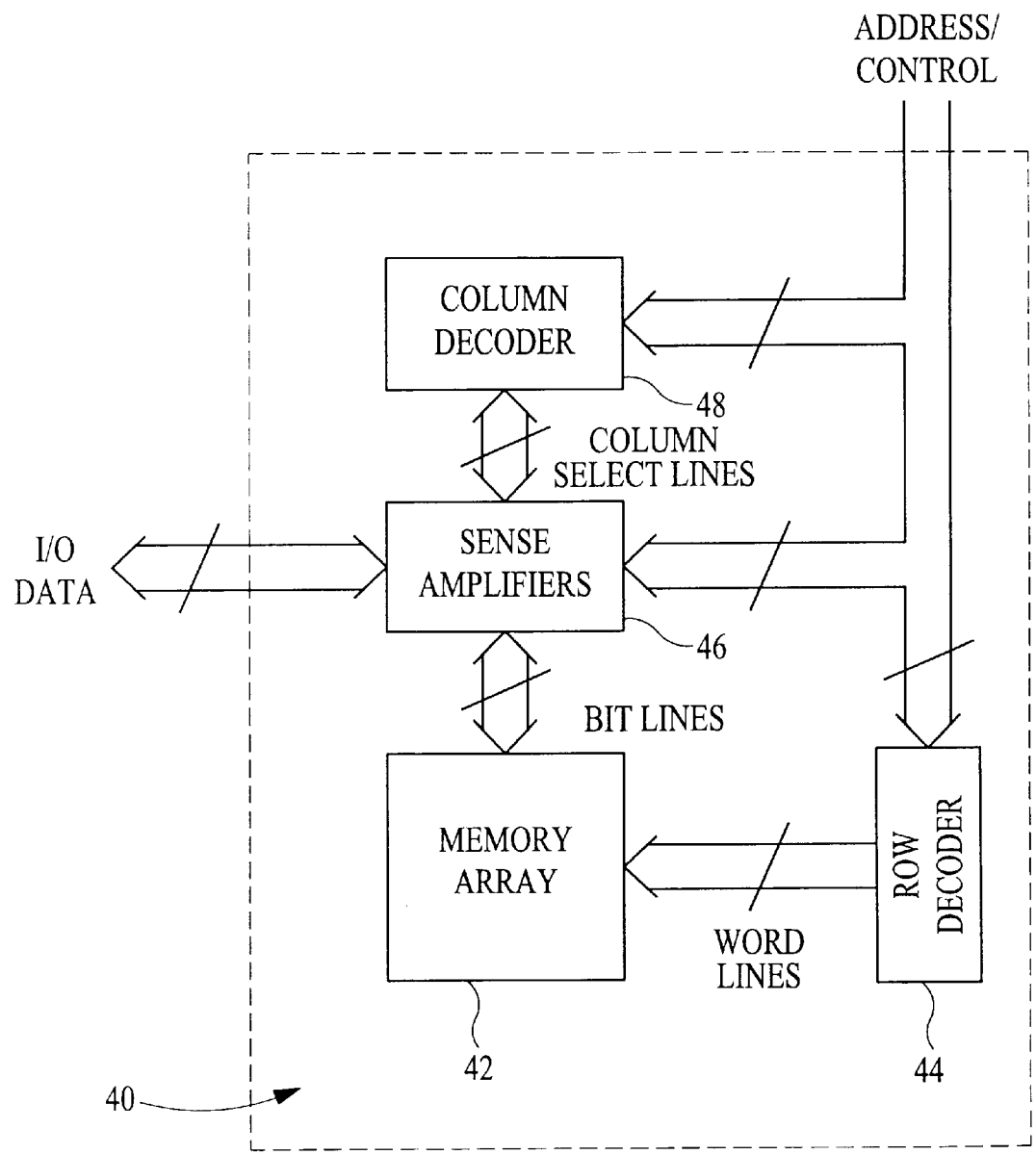
FIG. 2 is a block diagram illustrating a DRAM device.

Referring again to FIGS. 5a and 5b, the cell 100 can be operated as a DRAM and a nonvolatile memory and is suitable for use in many applications and systems that require both DRAM and nonvolatile memory. Examples include a fault tolerant system, start-up conditions, the saving and/or restoring of the state of a central processing unit (CPU) that is executing software instructions in a protected mode of operation, and shadow memory applications. The cell 100 can be used as the array 42 within the DRAM device 40 illustrated in FIG. 2 or it can be used as a separate special purpose memory if so desired. Moreover, a DRAM device such as the device 40 illustrated in FIG. 2 can contain an array 42 having conventional DRAM cells and DRAM cells with repressed memory constructed in accordance with the present invention.

The decision when to access the cell 100 as a DRAM and when to access it as a nonvolatile memory is application specific. For example, data can be written into the DRAM portion of the cell 100 and copied to the nonvolatile portion. Similarly, data can be written into the nonvolatile portion and then copied in to the DRAM portion. It is also possible to operate the DRAM and nonvolatile portions independently of each other. Any of these methods can be used and the invention is not to be limited to any particular method of using the DRAM and nonvolatile portions of the cell 100.

Figure 3A:
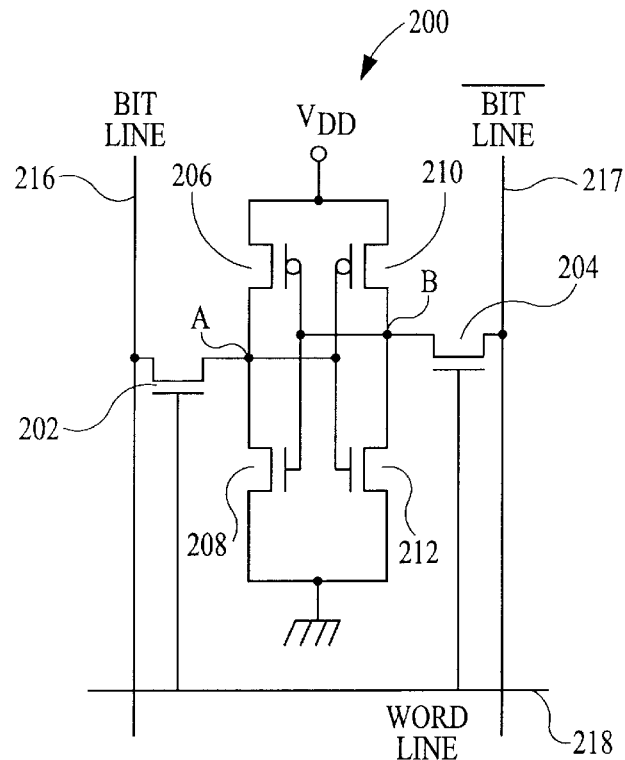
FIGS. 3a and 3b are circuit diagrams illustrating conventional static random access memory (SRAM) cells.
Figure 3B:
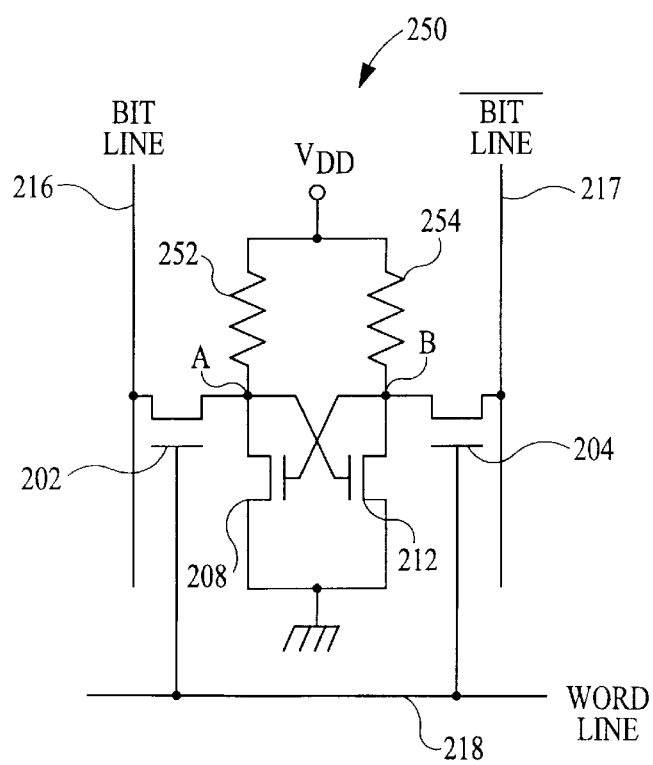
Figure 4:
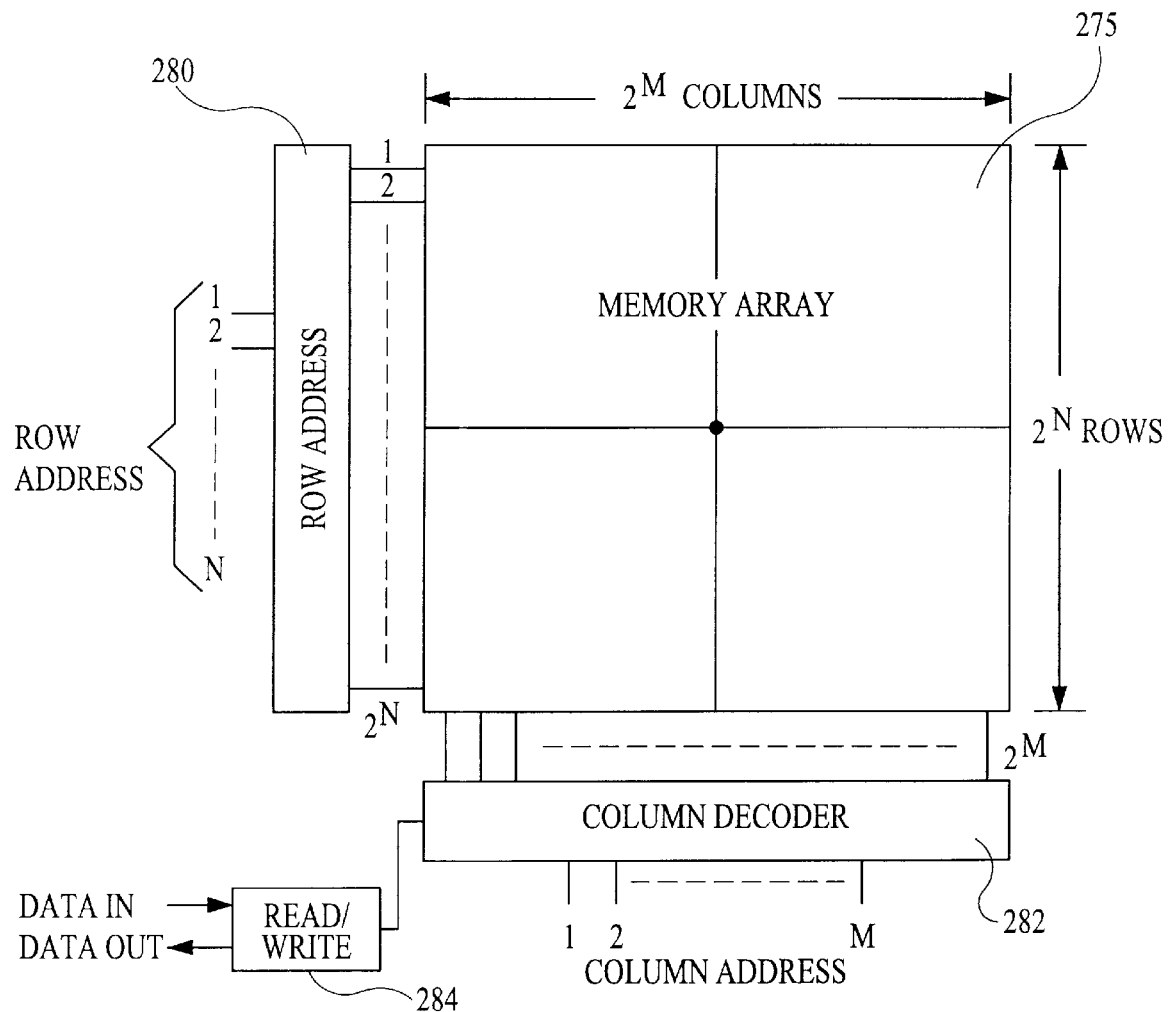
FIG. 4 is a block diagram illustrating a SRAM device.
Figure 8A:
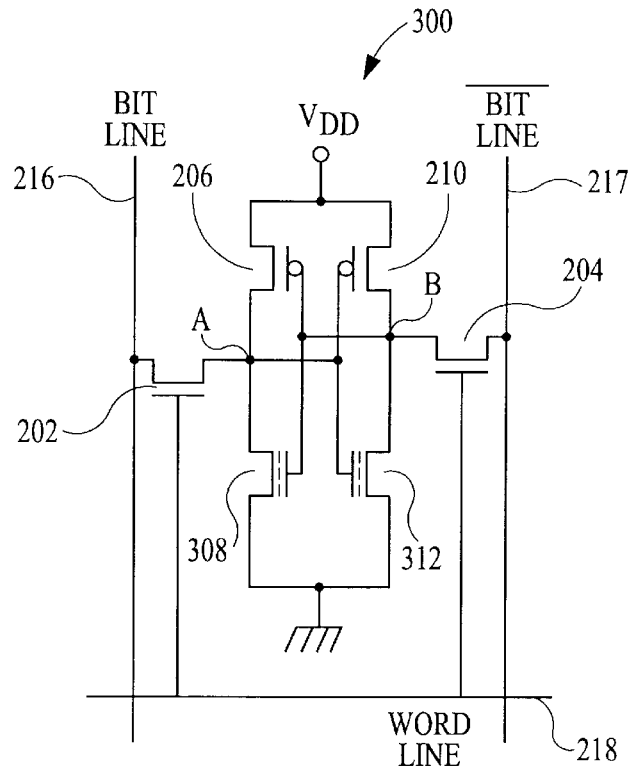
FIGS. 8a and 8b are circuit diagrams illustrating SRAM cells constructed in accordance with an embodiment of the present invention.
Figure 8B:
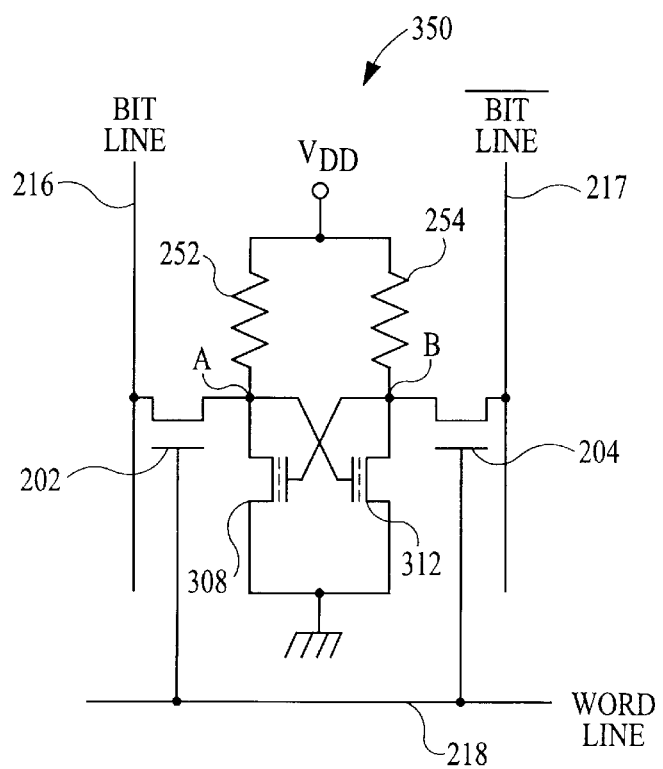

FIGS. 8a and 8b are circuit diagrams illustrating SRAM cells 300, 350 constructed in accordance with an embodiment of the present invention. The cells 300, 350 are similar to the cells 200, 250 illustrated in FIGS. 3a and 3b with the exception that different transistors 308, 312 replace the transistors 208, 212 (FIGS. 3a and 3b). The transistors 308, 312 are transistors having a control gate and a floating gate (described with reference to FIGS. 5a and 5b), and is of the kind often used in flash memory devices. As will be described below, the use of the transistors 308, 312 allows the cells 300, 350 of the present invention to be operated as either a conventional SRAM cell or as a nonvolatile memory cell (i.e., a SRAM with repressed memory).

When the cells 300, 350 are to be accessed as SRAM cells, information may be written to and read from the cells 300, 350 as described above with reference to FIGS. 3a and 3b. That is, data is stored with either a high potential at node A and a low potential at node B, or a low potential at node A and a high potential at node B. Similarly, the logic state of the SRAM cells 300, 350 is read by sensing the cell current on bit line pair comprised of bit lines 216 and 217 and/or the differential voltage developed thereon. If the cells 300, 350 are in logic state "1," node A is high and node B is low. If the cells 300, 350 are in logic state "0," would be the opposite with node A low and node B high.

For the cells 300, 350 to be used as nonvolatile memory, one of the transistors 308, 312 has to be programmed to the first charge state, while the other transistor has to be programmed to the second charge state. For example, to place the cells 300, 350 into logic state "1," i.e., node A high, node B low, transistor 308 must be programmed into the first charge state and transistor 312 into the second charge state. This raises the resistance of transistor 308, making it less conductive and causing node A to be high, while node B goes low. Similarly, to place the cells 300, 350 into logic state "0," i.e., node A low, node B high, transistor 312 must be programmed into the first charge state and transistor 308 into the second charge state. This raises the resistance of transistor 312, making it less conductive and causing node B to be high, while node A goes low.

The floating gate of transistors 308 and 312 are programmed with the tunnel-tunnel mode technique. That is, a tunnel mode is used to transfer electrons from the source to the floating gate of the transistors 308, 312 to program the gates and the transistors 308, 312 to the first charge state (i.e., tunnel write operation). For convenience purposes only, this operation is described for transistor 308 only. To program transistor 308 (and its floating gate) to the first charge state, transistors 202, 204 must be turned on and the floating gate of the transistor 308 must be driven with a large positive voltage (through its control gate and via bit line 217), such as, for example, twelve or fifteen volts, while grounding its source at node A (via the bit line 216). This causes electrons to travel to the floating gate and results in transistor 308 (and its floating gate) being programmed to the first charge state.

Likewise, a tunnel mode is used to program the transistor 308 and its floating gate to the second charge state (i.e., tunnel erase operation). This is accomplished by turning on transistors 202, 204, and driving the floating gate of the transistor 308 with a large negative voltage (through its control gate and via bit line 217), such as, for example, negative seven or ten volts, while driving its source at node A (via the bit line 216) with a positive voltage, such as, for example, five volts. This causes electrons to travel to the source terminal of the transistor 308e and results in transistor 308 (and its floating gate) being programmed to the second charge state.

When the SRAM cells 300, 350 are programmed in this manner upon start-up and/or when power supply voltage is first applied to the cells they will always start in one preferred state with either a logic state "0" or a logic state "1" stored in the cell. The use of the SRAM cells 300, 350 in this manner is particularly useful for start-up conditions and the saving and/or restoring of the state of a central processing unit (CPU) that is executing software instructions in a protected mode of operation. Moreover, these SRAM cells 300, 350 can be used instead of the typical ROM devices used for start-up.

Figure 9:
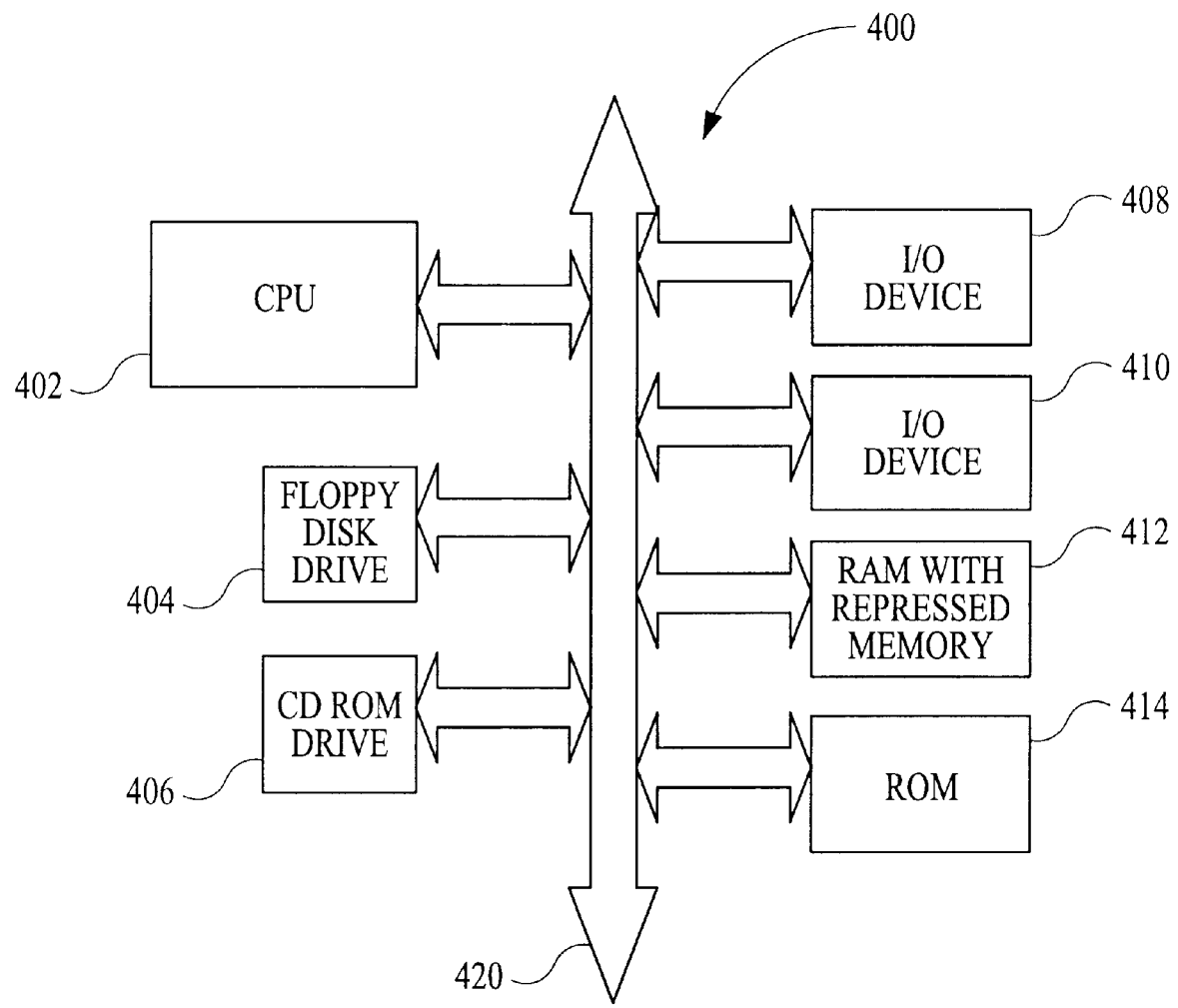
FIG. 9 illustrates a block diagram of a computer system utilizing either the DRAM cells illustrated in FIGS. 5a and 5b or the SRAM cells illustrated in FIGS. 8a and 8b.

FIG. 9 is a block diagram of a processor-based system 400 utilizing RAM with repressed memory 412 constructed in accordance with the present invention. That is, the RAM 412 utilizes the DRAM cell 100 illustrated in FIGS. 5a and 5b or the SRAM cells 300, 350 illustrated in FIGS. 8a and 8b.

The processor-based system 400 may be a computer system, a process control system or any other system employing a processor and associated memory. The system 400 includes a central processing unit (CPU) 402, e.g., a microprocessor, that communicates with the RAM 412 and an I/O device 408 over a bus 420. It must be noted that the bus 420 may be a series of buses and bridges commonly used in a processor-based system, but for convenience purposes only, the bus 420 has been illustrated as a single bus. A second I/O device 410 is illustrated, but is not necessary to practice the invention. The processor-based system 400 also includes read-only memory (ROM) 414 and may include peripheral devices such as a floppy disk drive 404 and a compact disk (CD) ROM drive 406 that also communicates with the CPU 402 over the bus 420 as is well known in the art.

It should be noted that the repressed memory state stored on the floating gate can be determined as a separate operation by measuring independently the threshold voltage of the transfer devices. The storage capacitor can first be fully charged and then the current supplied by the transfer device is measured at many different gate voltages. A linear regression can be used to determine the threshold voltage or repressed memory state stored. This operation will take a relatively longer time than the operation as a normal DRAM or SRAM.

It should be noted that structures other than the floating polysilicon gate, or different materials for the floating gate, may be used to trap electrons where charging is performed by tunneling of the electrons to and from the silicon. For instance, composite insulators can be employed in the MIOS devices that introduce trapping states between the insulators as in MNOS devices that have been used in nonvolatile memories.

Figure 10:
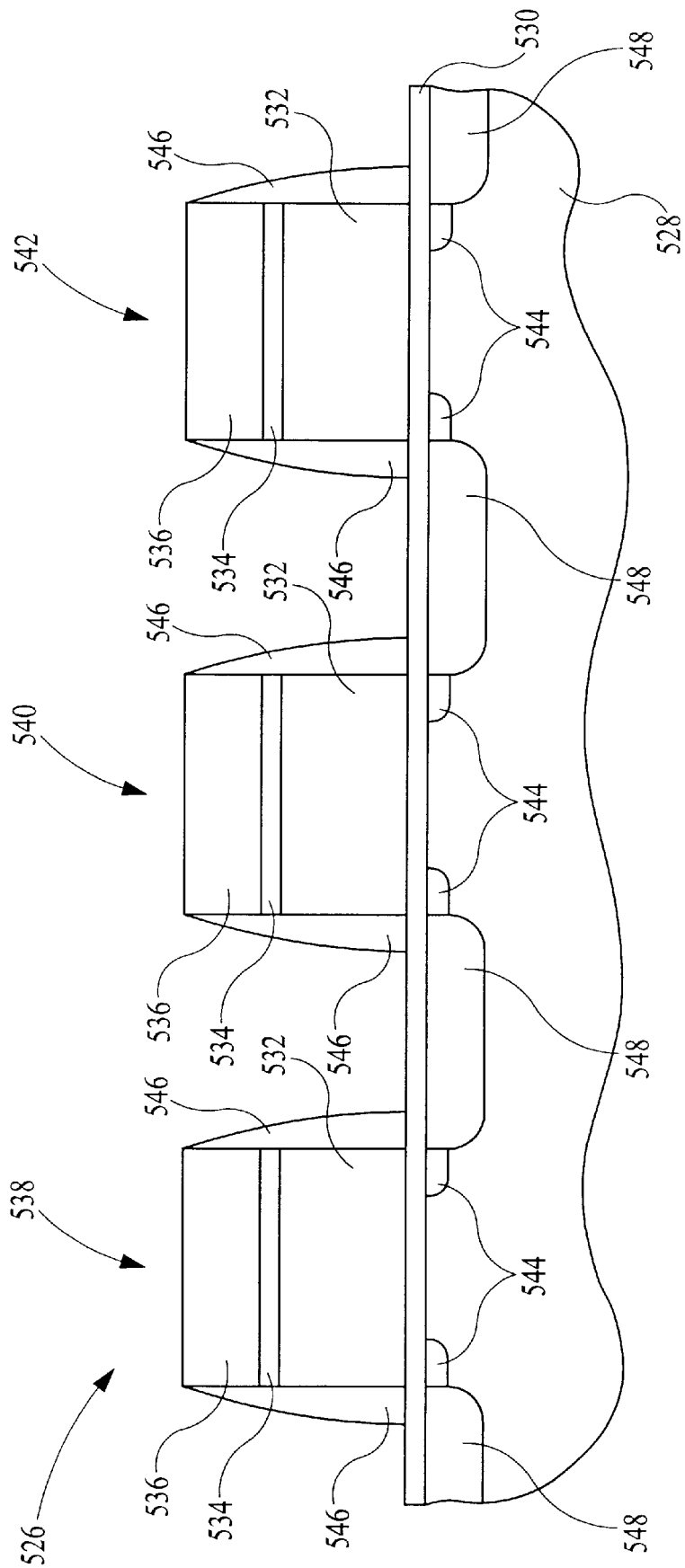
FIG. 10 illustrates a silicon oxide nitride oxide silicon (SONOS) memory device constructed in accordance with the present invention.

FIG. 10 illustrates a silicon oxide nitride oxide silicon (SONOS) memory devices 526 where charges can be ejected/stored in a dielectric layer to construct a volatile memory with a repressed memory state. The devices 526 include a substrate 528, typically of monocrystalline silicon, which may or may not be lightly doped with a conductivity enhancing impurity, such as a p-type, to produce a bulk substrate well. An oxide-nitride-oxide layer 530 is provided immediately adjacent bulk substrate 528 and would preferably constitute the typical ONO construction for a SONOS cell, such as $SiO_2/Si_3N_4/SiO_2$. A polysilicon gate layer 532 is provided immediately adjacent ONO layer 530. An oxide layer 34 (e.g., $SiO_2$) and a nitride layer 536 (e.g., $Si_3N_4$) are provided outwardly of layer 532.

The layers above the bulk substrate 528 are patterned to provide a series of SONOS gates 538, 540, 542. After gate formation, lightly-doped-drain (LDD) doping is conducted between the adjacent gates 538 and 540 with a conductivity-enhancing impurity of the first conductivity type to form diffusion regions 544, which will ultimately be utilized to form LDD regions for each of adjacent transistor gates 538 and 540. One example and preferred conductivity type for the LDD doping is n-type impurity.

A layer of nitride is deposited and anisotropically etched to produce spacers 546 about gates 538 and 540. Subsequently, further doping is conducted between adjacent gates 538 and 540 with a conductivity enhancing impurity of the first conductivity type at a sufficient dose to form source/drain region 548, which is hereinafter termed as a source/drain interconnecting region. Such a region is provided to a greater dose and depth than the doping to produce LDD diffusion region 544, as would be conventional and known by people of skill in the art. Conventional diffusion regions 544 and 548 are illustrated. SONOS memory devices are described in U.S. Pat. No. 5,424,569 to Prall, which is hereby incorporated by reference.

In addition, it should be noted that electrons can be trapped on isolated nano-crystals embedded in the oxide, or point defects in the oxide, and are introduced by implanting impurities into the oxide or are naturally occurring as part of the process. Floating gates made of materials with lower work functions, such as the one disclosed in U.S. Pat. No. 5,801,401 to Forbes, hereby incorporated by reference, which make the erase tunneling easier can also be used.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A memory cell comprising:
   at least one transistor, said transistor being operable in a first volatile memory mode of operation to access first information from a first source of information and providing said first information at an output and a second nonvolatile mode of operation to access second information from a second source of stored information and providing said second information at said output, wherein said first information is accessible without affecting said second information and said second information is accessible without affecting said first information.

2. The memory cell of claim 1 wherein said first source of information is a storage capacitor of a dynamic random access memory device.

3. The memory cell of claim 2 wherein said transistor comprises a control gate and an additional gate and said second source of information is said additional gate.

4. The memory cell of claim 3 wherein said additional gate is a floating gate.

5. The memory cell of claim 4 wherein said floating gate is comprised of polysilicon.

6. The memory cell of claim 3 wherein said second information is a charge representing a data value that is stored on said additional gate by tunneling electrons from a source region of said transistor to said additional gate.

7. The memory cell of claim 3 wherein said second information is a charge representing a data value that is stored on said additional gate by tunneling electrons from said additional gate to a source region of said transistor.

8. The memory cell of claim 1 wherein said first source of information is a static random access memory device.

9. The memory cell of claim 1 wherein said first source of information is a silicon oxide nitride oxide silicon (SONOS) memory device.

10. A memory cell comprising:
   a transistor having a source region, drain region, channel region between said source and drain regions, and a first gate and second gate, said first gate being coupled to a word line input, one of said source and drain regions being coupled to a bit line input, said second gate being positioned between said first gate and said channel region; and a data storage capacitor coupled between a first voltage and the other of said source and drain region not connected to said bit line input, wherein said transistor is controllable to access a first charge representing a data value from said capacitor in a first mode of operation and a second charge representing a data value from said second gate in a second mode of operation, wherein said first charge is accessible without affecting said second charge and said second charge is accessible without affecting said first charge.

11. The memory cell of claim 10 wherein said first gate is a control gate and said second gate is a floating gate.

12. The memory cell of claim 11 wherein said floating gate is comprised of polysilicon.

13. The memory cell of claim 11 wherein said second charge is stored on said floating gate by tunneling electrons from said source to said floating gate.

14. The memory cell of claim 11 wherein said second charge is stored on said floating gate by tunneling electrons from said floating gate to said source.

15. The memory cell of claim 10 wherein said first mode of operation is a volatile memory mode of operation.

16. The memory cell of claim 15 wherein said first charge is read from said storage capacitor by applying a voltage in excess of a threshold voltage of said transistor to said control gate and sensing a potential of said bit line.

17. The memory cell of claim 10 wherein said second mode of operation is a nonvolatile memory mode of operation.

18. The memory cell of claim 17 wherein said second charge is read from said floating gate by applying a voltage approximately equal to a threshold voltage of said transistor to said control gate and sensing a response time of said transistor.

19. A memory cell, comprising:
first and second transistors, each transistor having a source region, drain region, channel region between said source and drain regions, and a first gate and second gate, each second gate being positioned between its respective first gate and channel, said first gate of said first transistor is connected to a first node, said first gate of said second transistor is connected to a second node, said first and second nodes being connected to a first voltage, said source and drain regions of said first transistor being connected between said second node and a second voltage, said source and drain regions of said second transistor being connected between said first node and the second voltage; and
a control circuit for coupling said first and second nodes to bit line inputs, each of said nodes having a respective potential representative of data stored in said cell, wherein data is stored in said cell by activating one of said transistors and deactivating the other transistor in a first mode of operation and by storing a first charge on said first transistor and a second charge on said second transistor in a second mode of operation, and wherein only the bit line inputs and a word line input are used by said control circuit to store data in said cell in both said first and second modes.

20. The memory cell of claim 19 wherein said first gate is a control gate and said second gate is a floating gate.

21. The memory cell of claim 20 wherein said floating gate is comprised of polysilicon.

22. The memory cell of claim 20 wherein said charge is stored on said floating gate by tunneling electrons from said source to said floating gate.

23. The memory cell of claim 20 wherein said charge is stored on said floating gate by tunneling electrons from said floating gate to said source.

24. The memory cell of claim 19 wherein said first mode of operation is a volatile memory mode of operation.

25. The memory cell of claim 19 wherein said second mode of operation is a nonvolatile memory mode of operation.

26. A memory circuit comprising:
a plurality of memory cells organized as an array of rows and columns, at least one memory cell comprising:
at least one transistor, said transistor being operable in a first volatile memory mode of operation to access first information from a first source of information and providing said first information at an output and a second nonvolatile mode of operation to access second information from a second source of stored information and providing said second information at said output, wherein said first information is accessible without affecting said second information and said second information is accessible without affecting said first information.

27. The memory circuit of claim 26 wherein said first source of information is a storage capacitor of a dynamic random access memory device.

28. The memory circuit of claim 27 wherein said transistor comprises a control gate and an additional gate and said second source of information is said additional gate.

29. The memory circuit of claim 28 wherein said additional gate is a floating gate.

30. The memory circuit of claim 29 wherein said floating gate is comprised of polysilicon.

31. The memory circuit of claim 28 wherein said second information is a charge representing a data value that is stored on said additional gate by tunneling electrons from a source region of said transistor to said additional gate.

32. The memory circuit of claim 28 wherein said second information is a charge representing a data value that is stored on said additional gate by tunneling electrons from said additional gate to a source region of said transistor.

33. The memory circuit of claim 26 wherein said first source of information is a static random access memory device.

34. The memory circuit of claim 26 wherein said first source of information is a silicon oxide nitride oxide silicon (SONOS) memory device.

35. A memory circuit comprising:
a plurality of memory cells organized as an array of rows and columns, at least one memory cell comprising:
a transistor having a source region, drain region, channel region between said source and drain regions, and a first gate and second gate, said first gate being coupled to a word line input, one of said source and drain regions being coupled to a bit line input, said second gate being positioned between said first gate and said channel region; and
a data storage capacitor coupled between a first voltage and the other of said source and drain region not connected to said bit line input, wherein said transistor is controllable to access a first charge representing a data value from said capacitor in a first mode of operation and a second charge representing a data value from said second gate in a second mode of operation, wherein said first charge is accessible without affecting said second charge and said second charge is accessible without affecting said first charge.

36. The memory circuit of claim 35 wherein said first gate is a control gate and said second gate is a floating gate.

37. The memory circuit of claim 36 wherein said floating gate is comprised of polysilicon.

38. The memory circuit of claim 36 wherein said second charge is stored on said floating gate by tunneling electrons from said source to said floating gate.

39. The memory circuit of claim 36 wherein said second charge is stored on said floating gate by tunneling electrons from said floating gate to said source.

40. The memory circuit of claim 35 wherein said first mode of operation is a volatile memory mode of operation.

41. The memory circuit of claim 40 wherein said first charge is read from said storage capacitor by applying a voltage in excess of a threshold voltage of said transistor to said control gate and sensing a potential of said bit line.

42. The memory circuit of claim 35 wherein said second mode of operation is a nonvolatile memory mode of operation.

43. The memory circuit of claim 42 wherein said second charge is read from said floating gate by applying a voltage approximately equal to a threshold voltage of said transistor to said control gate and sensing a response time of said transistor.

44. A memory circuit comprising:
a plurality of memory cells organized as an array of rows and columns, at least one memory cell comprising:
first and second transistors, each transistor having a source region, drain region, channel region between said source and drain regions, and a first gate and second gate, each second gate being positioned between its respective first gate and channel, said first gate of said first transistor is connected to a first node, said first gate of said second transistor is connected to a second node, said first and second nodes being connected to a first voltage, said source and drain regions of said first transistor being connected between said second node and a second voltage, said source and drain regions of said second transistor being is connected between said first node and the second voltage; and
a control circuit for coupling said first and second nodes to bit line inputs, each of said nodes having a respective potential representative of data stored in said cell, wherein data is stored in said cell by activating one of said transistors and deactivating the other transistor in a first mode of operation and by storing a first charge on said first transistor and a second charge on said second transistor in a second mode of operation, and wherein only the bit line inputs and a word line input are used by said control circuit to store data in said cell in both said first and second modes.

45. The memory circuit of claim 44 wherein said first gate is a control gate and said second gate is a floating gate.

46. The memory circuit of claim 45 wherein said floating gate is comprised of polysilicon.

47. The memory circuit of claim 45 wherein said charge is stored on said floating gate by tunneling electrons from said source to said floating gate.

48. The memory circuit of claim 45 wherein said charge is stored on said floating gate by tunneling electrons from said floating gate to said source.

49. The memory circuit of claim 45 wherein said first mode of operation is a volatile memory mode of operation.

50. The memory circuit of claim 44 wherein said second mode of operation is a nonvolatile memory mode of operation.

51. A processor-based system, comprising:
a processor;
a memory circuit coupled to said processor, said memory circuit comprising a plurality of memory cells organized as an array of rows and columns, at least one memory cell comprising:
at least one transistor, said transistor being operable in a first volatile memory mode of operation to access first information from a first source of information and providing said first information at an output and a second nonvolatile mode of operation to access second information from a second source of stored information and providing said second information at said output, wherein said first information is accessible without affecting said second information and said second information is accessible without affecting said first information.

52. The system claim 51 wherein said first source of information is a storage capacitor of a dynamic random access memory device.

53. The system of claim 52 wherein said transistor comprises a control gate and an additional gate and said second source of information is said additional gate.

54. The system of claim 53 wherein said additional gate is a floating gate.

55. The system of claim 54 wherein said floating gate is comprised of polysilicon.

56. The system of claim 53 wherein said second information is a charge representing a data value that is stored on said additional gate by tunneling electrons from a source region of said transistor to said additional gate.

57. The system of claim 53 wherein said second information is a charge representing a data value that is stored on said additional gate by tunneling electrons from said additional gate to a source region of said transistor.

58. The system of claim 51 wherein said first source of information is a static random access memory device.

59. The system of claim 51 wherein said first source of information is a silicon oxide nitride oxide silicon (SONOS) memory device.

60. A processor-based system, comprising:
a processor;
a memory circuit coupled to said processor, said memory circuit comprising a plurality of memory cells organized as an array of rows and columns, at least one memory cell comprising:
a transistor having a source region, drain region, channel region between said source and drain regions, and a first gate and second gate, said first gate being coupled to a word line input, one of said source and drain regions being coupled to a bit line input, said second gate being positioned between said first gate and said channel region; and
a data storage capacitor coupled between a first voltage and the other of said source and drain region not connected to said bit line input, wherein said transistor is controllable to access a first charge representing a data value from said capacitor in a first mode of operation and a second charge representing a data value from said second gate in a second mode of operation, wherein said first charge is accessible without affecting said second charge and said second charge is accessible without affecting said first charge.

61. The system of claim 60 wherein said first gate is a control gate and said second gate is a floating gate.

62. The system of claim 61 wherein said floating gate is comprised of polysilicon.

63. The system of claim 61 wherein said second charge is stored on said floating gate by tunneling electrons from said source to said floating gate.

64. The system of claim 61 wherein said second charge is stored on said floating gate by tunneling electrons from said floating gate to said source.

65. The system of claim 60 wherein said first mode of operation is a volatile memory mode of operation.

66. The system of claim 65 wherein said first charge is read from said storage capacitor by applying a voltage in excess of a threshold voltage of said transistor to said control gate and sensing a potential of said bit line.

67. The system of claim 60 wherein said second mode of operation is a nonvolatile memory mode of operation.

68. The system of claim 67 wherein said second charge is read from said floating gate by applying a voltage approximately equal to a threshold voltage of said transistor to said control gate and sensing a response time of said transistor.

69. A processor-based system, comprising:

a processor;

a memory circuit coupled to said processor, said memory circuit comprising a plurality of memory cells organized as an array of rows and columns, at least one memory cell comprising:

first and second transistors, each transistor having a source region, drain region, channel region between said source and drain regions, and a first gate and second gate, each second gate being positioned between its respective first gate and channel, said first gate of said first transistor is connected to a first node, said first gate of said second transistor is connected to a second node, said first and second nodes being connected to a first voltage, said source and drain regions of said first transistor being connected between said second node and a second voltage, said source and drain regions of said second transistor being is connected between said first node and the second voltage; and control circuitry for coupling said first and second nodes to bit line inputs, each of said nodes having a respective potential representative of data stored in said cell, wherein data is stored in said cell by activating one of said transistors and deactivating the other transistor in a first mode of operation and by storing a first charge on said first transistor and a second charge on said second transistor in a second mode of operation, and wherein only the bit line inputs and a word line input are used by said control circuit to store data in said cell in both said first and second modes.

70. The system of claim 69 wherein said first gate is a control gate and said second gate is a floating gate.

71. The system of claim 70 wherein said floating gate is comprised of polysilicon.

72. The system of claim 70 wherein said charge is stored on said floating gate by tunneling electrons from said source to said floating gate.

73. The system of claim 70 wherein said charge is stored on said floating gate by tunneling electrons from said floating gate to said source.

74. The system of claim 69 wherein said first mode of operation is a volatile memory mode of operation.

75. The system of claim 69 wherein said second mode of operation is a nonvolatile memory mode of operation.

76. A method of reading information from a memory cell comprising at least one transistor, said method comprising the steps of:

reading first information from a first source of stored information in a first volatile memory mode of operation; and reading second information from a second source of stored information in a second nonvolatile mode of operation, wherein said first information is read without affecting said second information and said second information is read without affecting said first information.

77. The method of claim 76 wherein the first mode of operation is a volatile memory mode of operation.

78. The method of claim 77 wherein the second mode of operation is a nonvolatile memory mode of operation.

79. A method of reading information from a memory cell comprising a transistor having a control gate and a floating gate and a storage capacitor connected to said transistor, said method comprising the steps of:

reading a data value from the capacitor in a first mode of operation of the cell; and reading a data value from the floating gate in a second mode of operation of the cell, wherein the reading of a data value from the capacitor does not affect contents of the data value on the floating gate and the reading of a data value from the floating gate does not affect contents of the data value on the capacitor.

80. The method of claim 79 wherein the first mode of operation is a volatile memory mode of operation.

81. The method of claim 80 wherein said step of reading a data value from the capacitor comprises:

applying a voltage in excess of a threshold voltage of the transistor to its control gate; and sensing a potential of a charge stored in said capacitor.

82. The method of claim 80 wherein the second mode of operation is a nonvolatile memory mode of operation.

83. The method of claim 82 wherein said step of reading a data value from the floating gate comprises:

applying a voltage approximately equal to a threshold voltage of the transistor to its control gate; and sensing a response time of a sense amplifier sensing the transistor.

* * * * *

UNITED STATES PATENT AND TRADEMARK OFFICE
CERTIFICATE OF CORRECTION

PATENT NO. : 6,141,248
DATED : October 31, 2000
INVENTOR(S) : Leonard Forbes, et al.

It is certified that error appears in the above-identified patent and that said Letters Patent is hereby corrected as shown below:

Column 2:

Line 52, "There has been" should read --There have been--.

Column 5:

Line 4, "116 be is isolated" should read --116 be isolated--.

Column 13:

Claim 44, line 16, "being is connected" should read --being connected--.

Column 14:

Claim 52, line 1, "system claim" should read --system of claim--.

Column 14:

Claim 69, line 19, "being is connected" should read --being connected--.

Signed and Sealed this

Eighth Day of May, 2001

Attest:

NICHOLAS P. GODICI

Attesting Officer

Acting Director of the United States Patent and Trademark Office